United States Patent
Byun et al.

(10) Patent No.: US 6,906,341 B2
(45) Date of Patent: Jun. 14, 2005

(54) PROBE NEEDLE TEST APPARATUS AND METHOD

(75) Inventors: Soo-Min Byun, Yongin (KR); Joon-Su Ji, Suwon (KR); Byoung-Joo Kim, Hwaseong-gun (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/759,094

(22) Filed: Jan. 20, 2004

(65) Prior Publication Data

US 2004/0145386 A1 Jul. 29, 2004

(30) Foreign Application Priority Data

Jan. 29, 2003 (KR) .................................. 10-2003-0006022

(51) Int. Cl.[7] .............................................. H01L 23/58
(52) U.S. Cl. ............................. 257/48; 438/11; 438/14; 716/4
(58) Field of Search .......................... 257/48, E21.521, 257/E21.524; 438/11, 14, 15, 17, 18, FOR 101, FOR 142; 716/4–6

(56) References Cited

U.S. PATENT DOCUMENTS 6,770,496 B2 * 8/2004 Hamamura et al. ........... 438/18

2001/0015439 A1 * 8/2001 Hembree et al. ............. 257/48

FOREIGN PATENT DOCUMENTS

| JP | 11-087438 | 3/1999 |
| JP | 2002-026090 | 1/2002 |

* cited by examiner

Primary Examiner—Nathan J. Flynn
Assistant Examiner—Scott R. Wilson
(74) Attorney, Agent, or Firm—Volentine Francos & Whitt, pllc

(57) ABSTRACT

A test apparatus is provided which includes a substrate retainer, a probe card, a tester, a test head, and a main controller. The substrate retainer is for holding a substrate having a plurality of chips. The probe card has an array of probes aligned in rows and columns, and each of the probes is for contacting respective chips of the substrate held by the retainer and each includes a plurality of probe needles. The tester conducts a test routine by generating test signals and by receiving and analyzing return signals, and the test head is for sending the test signals from the tester to the probe card, and for sending the return signals from the probe card to the tester. The main controller includes a test result database for storing test data analyzed by the tester, and for executing a cleaning error detection program to determine whether the test data contains cleaning errors resulting from a lack of cleanliness of the probe needles of the probes.

7 Claims, 8 Drawing Sheets

|  |  |  |  | 23 | 24 |
|---|---|---|---|---|---|
|  | 17a |  |  | 22 | 25 |
| 9 | 10 | 12 | 16 | 21 | 26 |
| 8 | 11 | 13 | 20 | 28 | 27 |
| 7 | 6 | 14 | 19 | 30 | 29 |
| 5 | 4 | 15 | 18 | 32 | 31 |
| 3 | 2 | 1 | 17 | 64 | 63 |
| 35 | 34 | 33 | 49 | 62 | 61 |
| 37 | 36 | 47 | 50 | 60 | 59 |
| 39 | 38 | 46 | 51 | 53 | 58 |
| 40 | 43 | 45 | 52 | 54 | 57 |
| 41 | 42 | 44 | 48 | 55 | 56 |

PROBE NEEDLE TEST APPARATUS AND METHOD

BACKGROUND OF INVENTION

1. Field of the Invention

The present invention generally relates to the testing of devices on a substrate, such as semiconductor chips on a wafer, and more particularly, the present invention relates to a test probe apparatus and method which include a mechanism for determining when cleaning of probe needles is necessary.

A claim of priority under 35 U.S.C. § 119 is made to Korean Patent Application No. 2003-0006022 filed on Jan. 29, 2003, the entire contents of which are hereby incorporated by reference.

2. Description of Related Art

The manufacture of semiconductor devices generally involves a fabrication process in which a wafer is patterned into a plurality of chips, and an assembly process in which the chips patterned on the wafer are divided into individual unit chips. In addition, between these processes, an electric die sorting (EDS) process is performed to test the electrical characteristics of each of the chips of the wafer. The EDS process is used to identify any defective chips of the wafer.

The EDS process typically employs a test apparatus which applies an electrical signal to the chips of a wafer, and detects defective chips by examining a signal returned from the chips on the wafer. The electrical signals are applied to the chips using a probe card having probe needles which contact electrode pads of the wafer.

As the contact frequency of the probe needles with the electrode pads of the wafer is increased, metal substances (for example, aluminum oxides) of the electrode pads tend to stick to the probe needles. This increases the contact resistance of the probe needles, which in turn deteriorates the reliability and yield of the test process.

Therefore, a cleaning process is conventionally used to remove residues present on the probe needles. Typically, an abrasive member in the shape of a wafer removes the residues by polishing. One such structure is disclosed in Japanese Patent Disclosure Pyoung No. 11-87438 (entitled by "CLEANING MEMBER OF PROBE LEADING EDGE, CLEANING METHOD, AND TESTING METHOD OF SEMICONDUCTOR WAFER"). Here, a cleaning member is configured by a polishing layer made of elastic resin and abrasives, and a substance removal film bonded to a surface of the polishing layer. During cleaning, the tip of the probe needle pierces the removal film and is polished by the polishing layer, and then substances stuck to the tip are removed by the removal film when the probe needle is extracted.

In the conventional apparatus, a cleaning process is performed on the probe needles in a predetermined cycle. For example, the cleaning process may be routinely performed after the testing of each set of five wafers.

One drawback of cyclical cleaning is that the cleaning is often performed before is it actually necessary. Since the abrasive used in the cleaning process results in wear on the probe needles, excessive cleaning reduces the expected life span of the probe needles.

Another cleaning apparatus is disclosed in Japanese Patent Disclosure Pyoung No. 2002-26090 (entitled by "WAFER HOLDER OF WAFER PROBING APPARATUS"). This apparatus is characterized by the provision of at least one spray nozzle placed on a wafer holder which ejects a three-state material in which solid, liquid, and gas states exist together. The probe needles of a probe card are cleaned by the spray. The apparatus, which includes a controller for controlling the spray and a controller unit for controlling the controller, is advantageous in that it avoids the use of an abrasive and thus increases the life span of the probe needles. However, the structure is highly complicated, and there is no mechanism for determining exactly when cleaning is necessary.

SUMMARY OF THE INVENTION

In accordance with a first aspect of the present invention, a test apparatus is provided which includes a substrate retainer, a probe card, a tester, a test head, and a main controller. The substrate retainer is for holding a substrate having a plurality of chips. The probe card has an array of probes aligned in rows and columns, and each of the probes is for contacting respective chips of the substrate held by the retainer and each includes a plurality of probe needles. The tester conducts a test routine by generating test signals and by receiving and analyzing return signals, and the test head is for sending the test signals from the tester to the probe card, and for sending the return signals from the probe card to the tester. The main controller includes a test result database for storing test data analyzed by the tester, and executes a cleaning error detection program to determine whether the test data contains cleaning errors resulting from a lack of cleanliness of the probe needles of the probes.

The main controller further may further include a cleaning error database for storing sample test data containing cleaning errors, and the cleaning error detection program may compare the test data stored in the test result database and the sample test data stored in the cleaning error database. Also, the cleaning error detection program may determine that the test data contains cleaning errors when the number of chips having matches between the test data and the sample test data is at least a reference value.

Further, the cleaning error detection program may determine that the test data contains cleaning errors by monitoring a number of times the test data associated with each of the respective probes indicates a chip failure in successive test routines.

According to another aspect of the present invention, a test method is provided which includes loading a substrate having a plurality of chips on a substrate retainer, and contacting probes of a probe card with respective chips of the substrate. The probe card has an array of probes aligned in rows and columns, and each of the probes includes a plurality of probe needles. A test routine is conducted by transmitting test signals to the respective chips via the probes of the probe card, receiving return signals from the respective chips via the probes of the probe card, and analyzing return signals to determine if the respective chips are defective to obtain resultant test data. The test data associated with each probe is then stored into a test result database. A cleaning error detection program is executed to determine whether the test data contains cleaning errors resulting from a lack of cleanliness of the probe needles of the probes.

The method may also include cleaning the probe needles of the probes if the cleaning error detection program determines that the test data contains cleaning errors, and loading a new substrate on the substrate retainer to conduct a new test sequence.

The method may further comprise storing the test data in a test result database, and storing sample test data containing cleaning errors a cleaning error database, where the cleaning error detection program compares the test data stored in the test result database and the sample test data stored in the cleaning error database. Also, the cleaning error detection program may determine that the test data contains cleaning errors when the number of chips having matches between the test data and the sample test data is at least a reference value.

Further, the cleaning error detection program may determine that the test data contains cleaning errors by monitoring a number of times the test data associated with each of the respective probes indicates a chip failure in successive test routines.

BRIEF DESCRIPTION OF THE DRAWINGS

The features of the present invention will become readily apparent from the detailed description that follows when taken in conjunction with the accompanying drawings, in which like reference numerals denote like parts, and in which:

FIG. 3a is a representation of the probe alignment of a probe card;

FIG. 3b is an enlarged view of a unit probe of FIG. 3a;

DETAILED DESCRIPTION OF THE PREFERRED EMBODIMENTS

Reference will now be made in detail to exemplary embodiments of the present invention, which are illustrated in the accompanying drawings.

Figure 1:
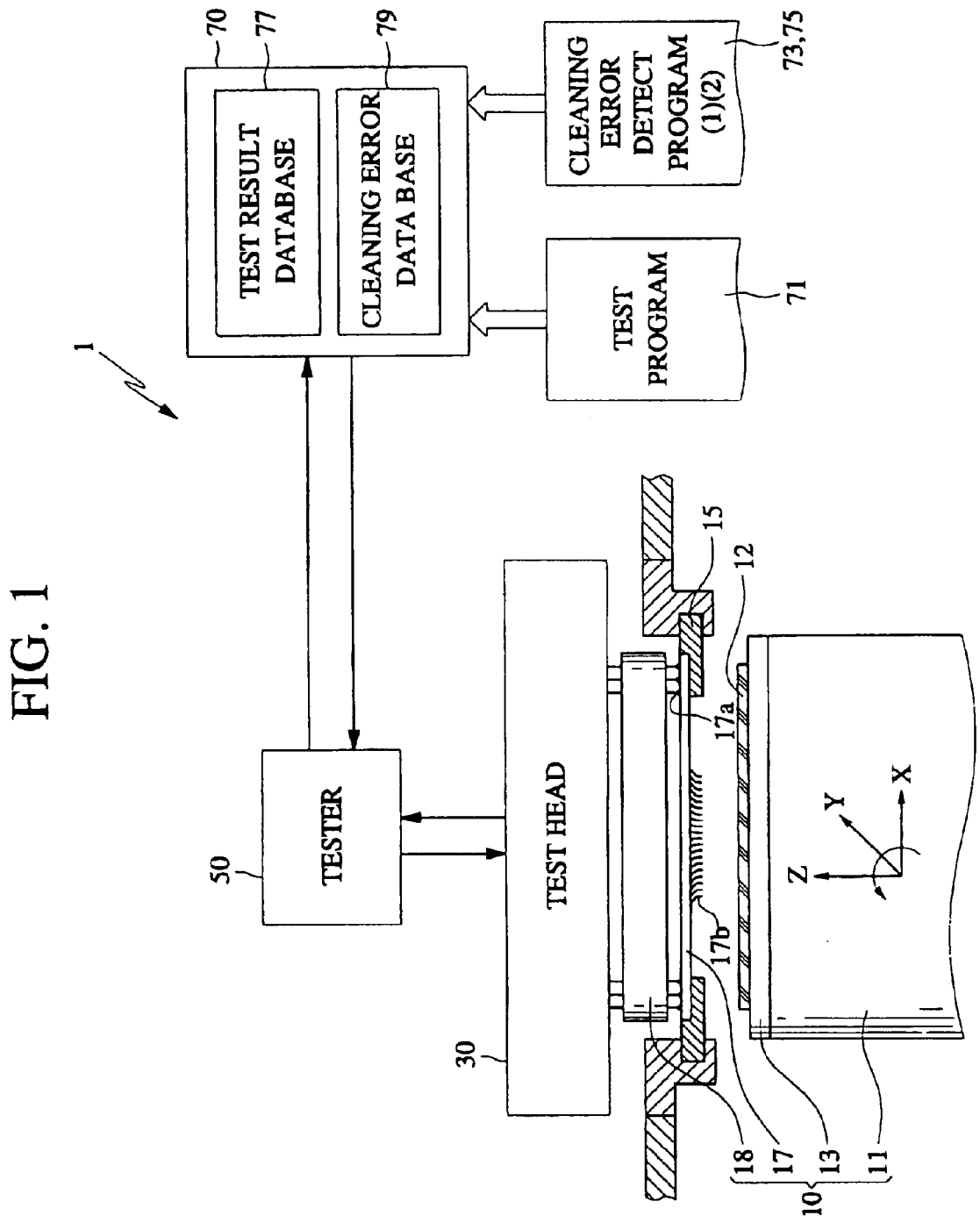
FIG. 1 is a schematic representation of the structure of a probing apparatus according to one embodiment of the present invention.

FIG. 1 illustrates a probing apparatus 1 according to one embodiment of the present invention. As shown, the apparatus 1 includes a prober 10, a test head 30, a tester 50, and a main controller 70.

The prober 10 includes an alignment stage 11 which is movable along X, Y, and Z axes and which can rotate about the Z axis. The prober 10 further includes a substrate retainer 13 for mounting a tested substrate ("wafer 12") thereon, and a probe card 17 supported by a mounting ring 15 located above the substrate retainer 13. The probe card 17 contacts the test head 30 through a block 18 of the prober 10.

Figure 2A:
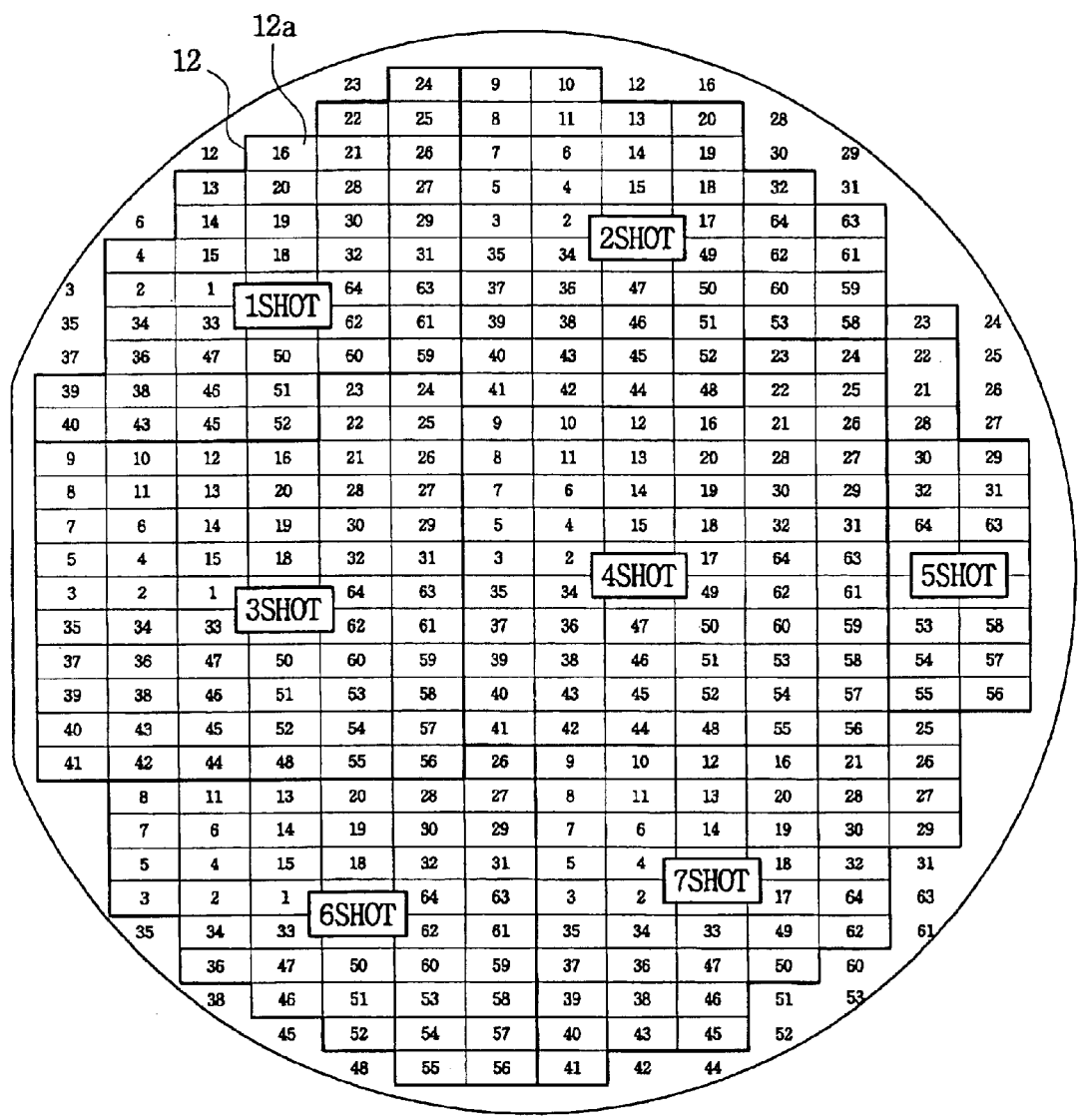
FIG. 2a is a plane view of the configuration of a wafer.
Figure 2B:
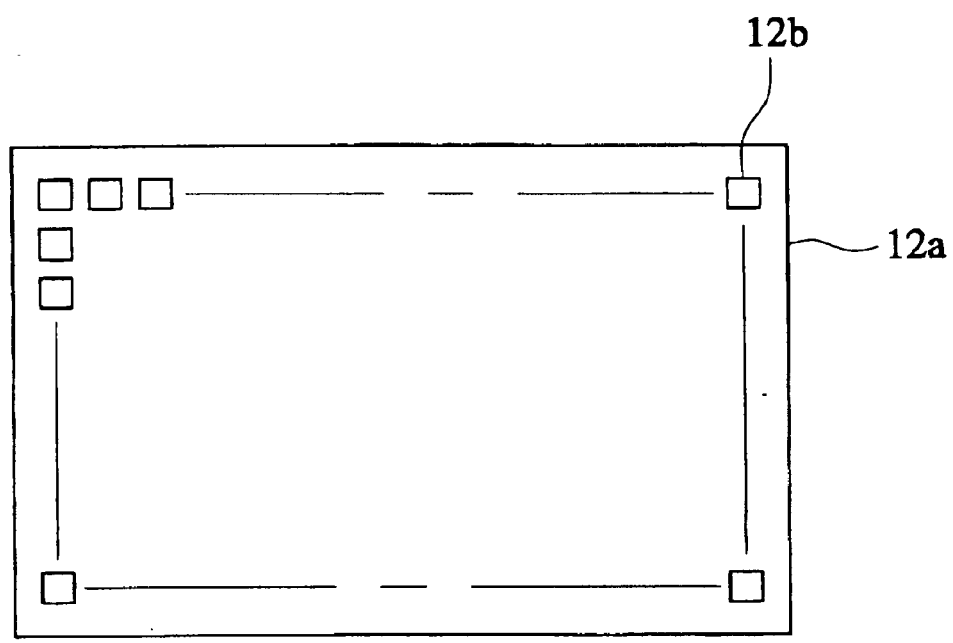
FIG. 2b is an enlarged view of the configuration of a unit chip.

As shown in FIG. 2A, the wafer 12 has a plurality of chips 12a aligned in columns and rows. Further, as shown in FIG. 2B, each chip 12a has a plurality of electrode pads 12b placed thereon.

Figures 3A, 3B:
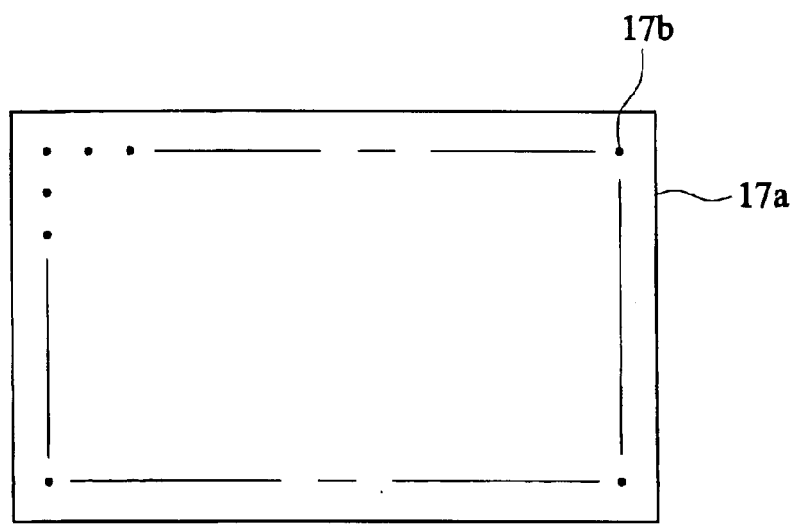

As shown in FIG. 3A, the probe card 17 includes a plurality of probes 17a arranged to as to correspond to a plurality of the wafer chips 12a. Also, as shown in FIG. 3B, each probe 17a has a plurality of probe needles 17b corresponding to the electrode pads 12b of the chips 12a.

With the exemplary probe card of FIG. 3A, which includes 64 probes 17a aligned as shown, the wafer 12 is divided into 7 test areas as shown in FIG. 2A. As such, a maximum of 64 chips 12a can be tested at the same time. It should be noted, however, the invention is not limited to the provision of 64 probes 17a, nor is it limited to the layout of FIG. 3A. In FIG. 2A, the 7 test areas are denoted as 1SHOT through 7SHOT, respectively.

In FIG. 3A, each probe 17a is labeled by a location number for convenience of explanation, and in FIG. 2A, the portions of each SHOT corresponding to each probe 17a are reference by the same numbers used to identify the probes 17a.

In operation, the test head 30 imparts a test signal to the probe card 17, and receives a response signal from the probe card 17. The tester 50 sends the test signal to the test head 30, and receives the response signal from the test head 30. Based on the sent and received test signals, the tester 50 detects whether any of the chips 12a is defective.

The main controller 70 has a test program 71 therein, and controls the entire probing apparatus according to the test program 71. In addition, the main controller 70 is equipped with cleaning error detect programs (1) (2) 73, 75, which function to detect whether the test results contain cleaning errors. Here, cleaning errors are testing errors which occur as a result of the probe needles 17a requiring cleaning. For example, probe needles having excessive foreign matter adhered thereto can result in normally operative chips being tested as defective.

The main controller 70 has a test result database 77 for storing data related each chip 12a which has been detected by the tester 50 as being defective. Further, the main controller 70 has a cleaning error database 79 for storing the data related to the cleaning failure of the probe needles 17b during several tests.

Figure 4:
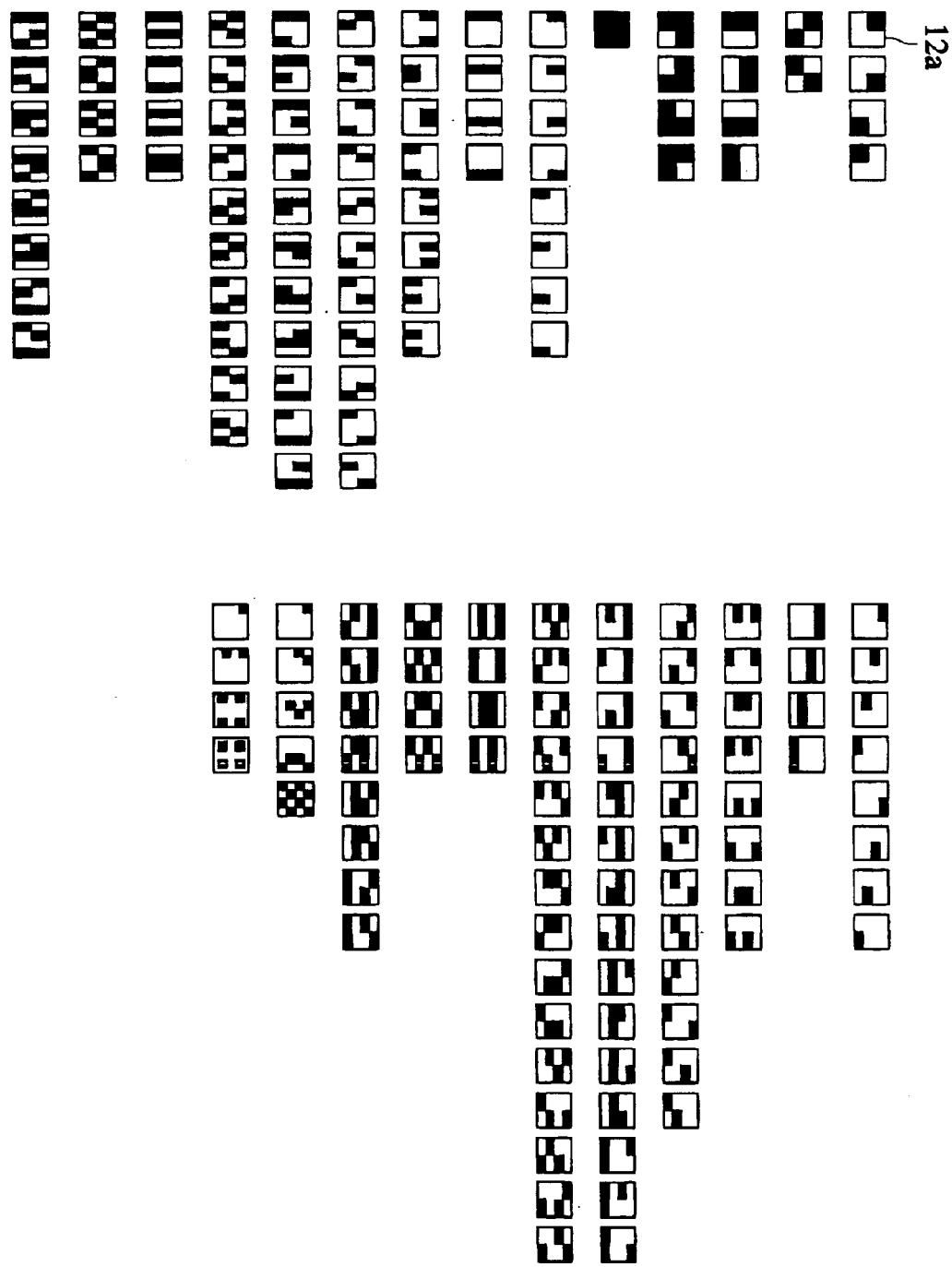
FIG. 4 illustrate samples of failure chip patterns which can result from cleaning errors.

That is, in the cleaning error database 79, there is stored the data indicative of failures such as those depicted in FIG. 4. FIG. 4 is a representation of types of cleaning errors which are determined in advance by experience, and stored as a table in the cleaning error database 79. Each square-shaped block depicted in FIG. 4 represents a unit chip 12a, and the portion colored as black represents, for example, memory cell areas in which failures have been detected. The illustrated patterns are considered to be indicative of possible cleaning errors, as opposed to actually failures in memory cell areas.

Figure 5:
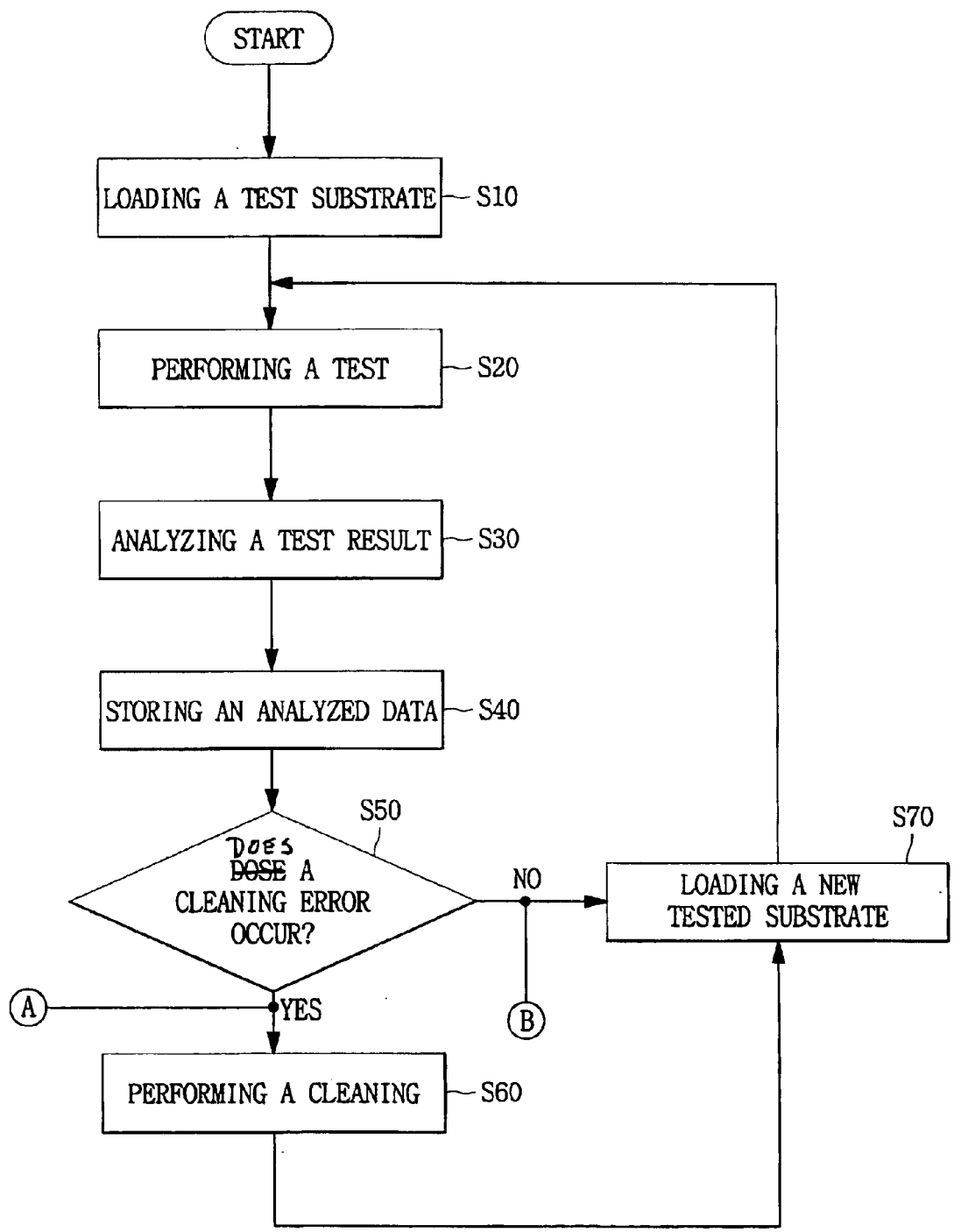
FIG. 5 is a flow chart illustrating a test process according to one embodiment of the present invention.
Figure 6:
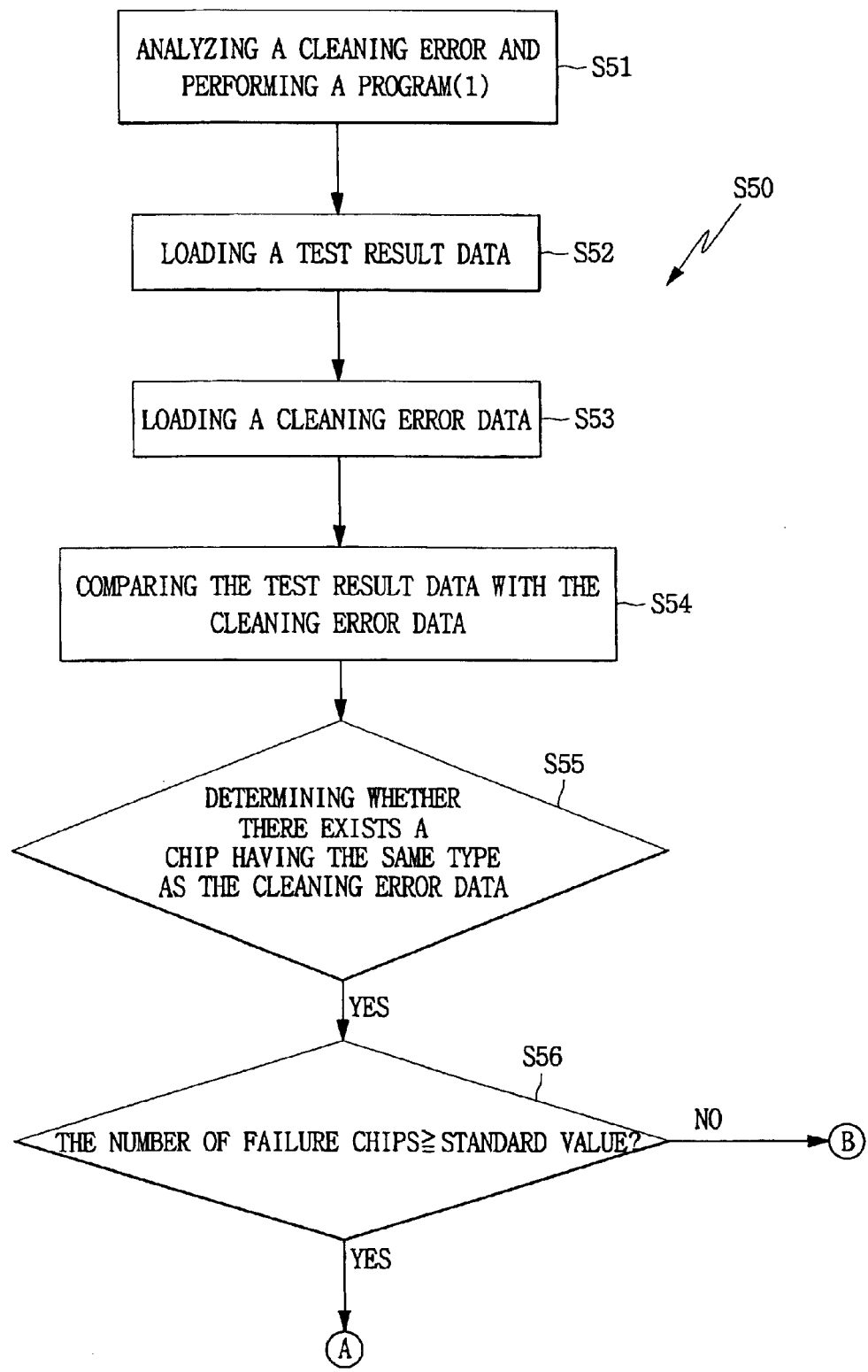
FIG. 6 is a flow chart of one exemplary process for detecting the occurrence of cleaning errors during the test process of FIG. 5.
Figure 7:
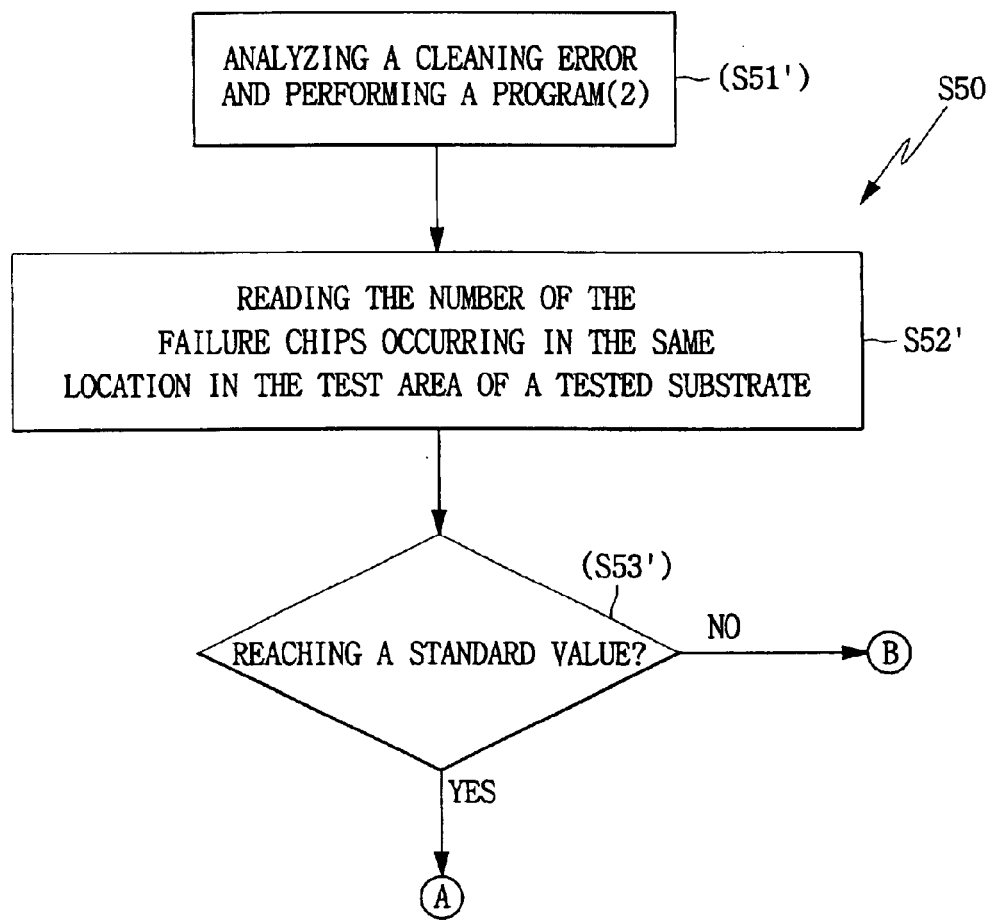
FIG. 7 is a flow chart of another exemplary process for detecting the occurrence of cleaning errors during the test process of FIG. 5.

Now, a method of determining when the probe needles need cleaning will be illustrated in reference to FIGS. 5 to 7.

First, a wafer 12, as a tested substrate, is loaded (S10) on a substrate retainer 13, and an aliment stage 11 is driven to contact electrode pads 12b on the chips 12a of the wafer 12 with the probe needles of a probe card 17, to thereby perform a test (S20).

The response signal from the probe card 17 is transmitted to a tester 50 through a test head 30, and the tester 50 examines failures of each chip 12a base on the response signal. The examined data is stored in a test result database 77 of a main controller 70 (S40). Then, as described later in more detail, a determination is made as to whether the examined data contains cleaning errors (S50).

If it is determined that the examined data contains cleaning errors, the main controller 70 sends a drive signal to a carrier mechanism (not shown) to load a cleaning substrate (not shown) on the upper surface of the substrate retainer 13 so as to perform a cleaning process for the probe needles 17b (S60). After the cleaning process is finished, a new wafer 12 is loaded (S70) to conduct another test process, and the processes described as above are repeated.

In the S50, if it is determined that the examined data does not contain cleaning errors, no cleaning is performed, and a new wafer 12 is loaded (S70) to conduct another test process, and the processes described as above are repeated.

The determination (S50) as to whether the examined data contains cleaning errors (S50) will now be described with reference to FIGS. 6 and 7. According to the embodiment of the present invention, two programs (1) and (2) are used to determine the existence of cleaning errors. Either one or both of the programs can be used.

As shown in FIG. 6, if a cleaning error detect program (1) is initiated (S51), test results are loaded (S52) from the test result database 77, and a cleaning error data is loaded (S53) from the cleaning error database 79.

Then, the test result data and the cleaning error data are compared (S54) to determine whether the defective chips stored in the test result database 77 exhibit a failure pattern which matches the cleaning error data illustrated in FIG. 4 (S55). The occurrence of a cleaning error is determined when the number of matches exceeds a predetermined value (S56). If the predetermined value is equaled or exceeded, then the probe needles are cleaned (S60) as described above in connection with FIG. 5. If the predetermined value is not reached, then a new substrate is loaded (S70) as also described above in connection with FIG. 5.

As shown in FIG. 7, if a cleaning error program (2) is initiated (S51'), the number of failure chips generated by each of the probes in each test area is checked (S52').

That is, as described previously, the probes 17a on the probe card 17 are aligned in a matrix configuration having, for example, 64 probes 17a as shown in FIG. 3a. The probes 17a aligned as such move through 7 test areas in the overall area of the wafer 12 as shown in FIG. 2a, and perform a test for each of the areas.

The number of times each probe 17a obtains a failure result as the testing moves through from 1SHOT to 7SHOT is monitored. For example, the probe 17a referred to as a numeral "18" in FIG. 3a corresponds to the chips 12a labeled as a numeral "18" in each SHOT, and contacts each of them in turn. In the step of S52', the number of the failure results at the chips locations of numeral "18" in each SHOT is examined. The same examination can be conducted with respect to other probes as well.

In the event that failure results are repeatedly obtained from the same probe 17a during the successive tests, it is determined that the test results contain cleaning errors. In this embodiment, a determination is made as to whether the number of times the same probe generates failure results has reached a predetermined value (standard value) (S53'). If so, the test results are considered to contain cleaning errors. For example, in the case of a wafer tested in seven SHOT's, the standard value may be in a range of 4 to 6. However, the invention is not limited to these values.

Described as above, the present invention provides the advantage of reliably indicating when probe needle cleaning operation is needed. As such, since cleaning is not performed before is it actually necessary, wear on the probe needles is reduced and the expected life span of the probe needles is increased.

While the present invention has been particularly shown and described with reference to exemplary embodiments thereof, it will be understood by those skilled in the art that the foregoing and other changes in form and details may be made therein without departing from the spirit and scope of the present invention.

What is claimed is:

1. A test apparatus comprising:
    a substrate retainer for holding a substrate having a plurality of chips;
    a probe card having an array of probes aligned in rows and columns, wherein each of the probes is for contacting respective chips of the substrate held by the retainer and each includes a plurality of probe needles;
    a tester which conducts a test routine by generating test signals and by receiving and analyzing return signals;
    a test head for sending the test signals from the tester to the probe card, and for sending the return signals from the probe card to the tester; and
    a main controller comprising a test result database for storing test data analyzed by the tester for executing a cleaning error detection program to determine whether the test data contains cleaning errors resulting from a lack of cleanliness of the probe needles of the probes, and a cleaning error database for storing sample test data containing cleaning errors, and wherein the cleaning error detection program compares the test data stored in the test result database and the sample test data stored in the cleaning error database.

2. The apparatus according to claim 1, wherein the cleaning error detection program determines that the test data contains cleaning errors when the number of chips having matches between the test data and the sample test data is at least a reference value.

3. The apparatus according to claim 1, wherein the cleaning error detection program determines that the test data contains cleaning errors by monitoring a number of times the test data associated with each of the respective probes indicates a chip failure in successive test routines.

4. A test method, comprising:
    loading a substrate having a plurality of chips on a substrate retainer;
    contacting probes of a probe card with respective chips of the substrate, the probe card having an array of probes aligned in rows and columns, wherein each of the probes includes a plurality of probe needles;
    conducting a test routine by transmitting test signals to the respective chips via the probes of the probe card, receiving return signals from the respective chips via the probes of the probe card, and analyzing return signals to determine if the respective chips are defective to obtain resultant test data;
    storing the test data associated with each probe into a test result database;
    executing a cleaning error detection program to determine whether the test data contains cleaning errors resulting from a lack of cleanliness of the probe needles of the probes; and
    storing the test data in a test result database, and storing sample test data containing cleaning errors in a cleaning error database, wherein the cleaning error detection program compares the test data stored in the test result database and the sample test data stored in the cleaning error database.

5. The method according to claim 4, further comprising:
    cleaning the probe needles of the probes if the cleaning error detection program determines that the test data contains cleaning errors, and then loading a new substrate on the substrate retainer to conduct a new test sequence; and loading a new substrate on the substrate retainer to conduct a new test sequence if the cleaning error detection program determines that the test data does not contain cleaning errors.

6. The method according to claim 4, wherein the cleaning error detection program determines that the test data contains cleaning errors when the number of chips having matches between the test data and the sample test data is at least a reference value.

7. The method according to claim 4, wherein the cleaning error detection program determines that the test data contains cleaning errors by monitoring a number of times the test data associated with each of the respective probes indicates a chip failure in successive test routines.

* * * * *